(12) United States Patent
Stanton et al.

(10) Patent No.: US 6,748,456 B1
(45) Date of Patent: Jun. 8, 2004

(54) PLD CONFIGURATION PORT ARCHITECTURE AND LOGIC

(75) Inventors: Richard L. Stanton, Austin, TX (US); Anup Nayak, Fremont, CA (US); Navaz Lulla, Fremont, CA (US); Harish Dangat, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 456 days.

(21) Appl. No.: 09/677,062

(22) Filed: Sep. 29, 2000

(51) Int. Cl.[7] .................................................. G06F 3/00
(52) U.S. Cl. .............................. 710/1; 716/16; 711/170; 326/39; 710/1
(58) Field of Search ........................... 716/16; 711/170; 326/39

(56) References Cited

U.S. PATENT DOCUMENTS

| 5,764,076 | A | * | 6/1998 | Lee et al. ........................ 326/38 |
| 6,172,520 | B1 | * | 1/2001 | Lawman et al. ................ 326/38 |
| 6,255,849 | B1 | * | 7/2001 | Mohan ........................... 326/41 |
| 6,304,101 | B1 | * | 10/2001 | Nishihara ........................ 326/41 |
| 6,308,311 | B1 | * | 10/2001 | Carmichael et al. ............ 716/16 |
| 6,327,634 | B1 | * | 12/2001 | Statovici ........................ 710/74 |

* cited by examiner

Primary Examiner—Jeffrey Gaffin
Assistant Examiner—Justin Knapp
(74) Attorney, Agent, or Firm—Christopher P. Maiorana, P.C.

(57) ABSTRACT

A programmable logic device (PLD) comprising a configuration controller. The configuration controller may be configured to (i) retrieve data and (ii) program a number of configuration bits of the PLD in response to the data.

20 Claims, 8 Drawing Sheets

| PARAMETER | DEFINITION: |
|---|---|
| $T_{OE}$ | OUTPUT ENABLE TO DATA |
| $T_{CE}$ | CHIP ENABLE TO DATA |
| $T_{CAC}$ | CLOCK TO DATA |
| $T_{SU}$ | CDATA SETUP TO CCLKI |
| $T_{OH}$ | CDATA HOLD FROM CCLKI |
| $T_{HC/LC}$ | CCLKI HIGH/LOW TIME |
| $T_{SCE}$ | CE SETUP TO CCLKI |
| $T_{HOE}$ | OE HIGH TO RESET COUNTER |
| $F_{MAX}$ | MAX INPUT FREQUENCY |

FIG. 9

PLD CONFIGURATION PORT ARCHITECTURE AND LOGIC

FIELD OF THE INVENTION

The present invention relates to a method and/or architecture for programmable logic devices generally and, more particularly, to a programmable logic device configuration port architecture and logic.

BACKGROUND OF THE INVENTION

A programmable logic device (PLD) provides an economical and efficient means for implementing predetermined Boolean logic functions in an integrated circuit. Such a device consists of, generally, an AND plane configured to generate predetermined product terms in response to a plurality of inputs, a group of fixed/programmable OR gates configured to generate a plurality of sum-of-product(SOP) terms in response to the product terms, and a number of logic elements (i.e., macrocells) configured to generate a desired output in response to the sum-of-products terms. The sum-of-products terms can also be generated using programmable NOR-NOR logic.

The arrangement and operation of components within the PLD are programmed by architecture configuration bits. The architecture configuration bits are set prior to normal operation of a PLD. The bits are set using an operation called "programming" or "configuration". The configuration bits can be stored in volatile memory (i.e., SRAM) or non-volatile memory (i.e., EEPROM/flash). When the configuration bits are stored in volatile memory, the configuration bits need to be loaded from an off-chip non-volatile memory, a micro controller, or some other source.

SUMMARY OF THE INVENTION

The present invention concerns a programmable logic device (PLD) comprising a configuration controller. The configuration controller may be configured to (i) retrieve data and (ii) program a number of configuration bits of the PLD in response to the data.

The objects, features and advantages of the present invention include providing a programmable logic device configuration port architecture and logic that may (i)provide flexible configuration capabilities, (ii) use data compression,

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
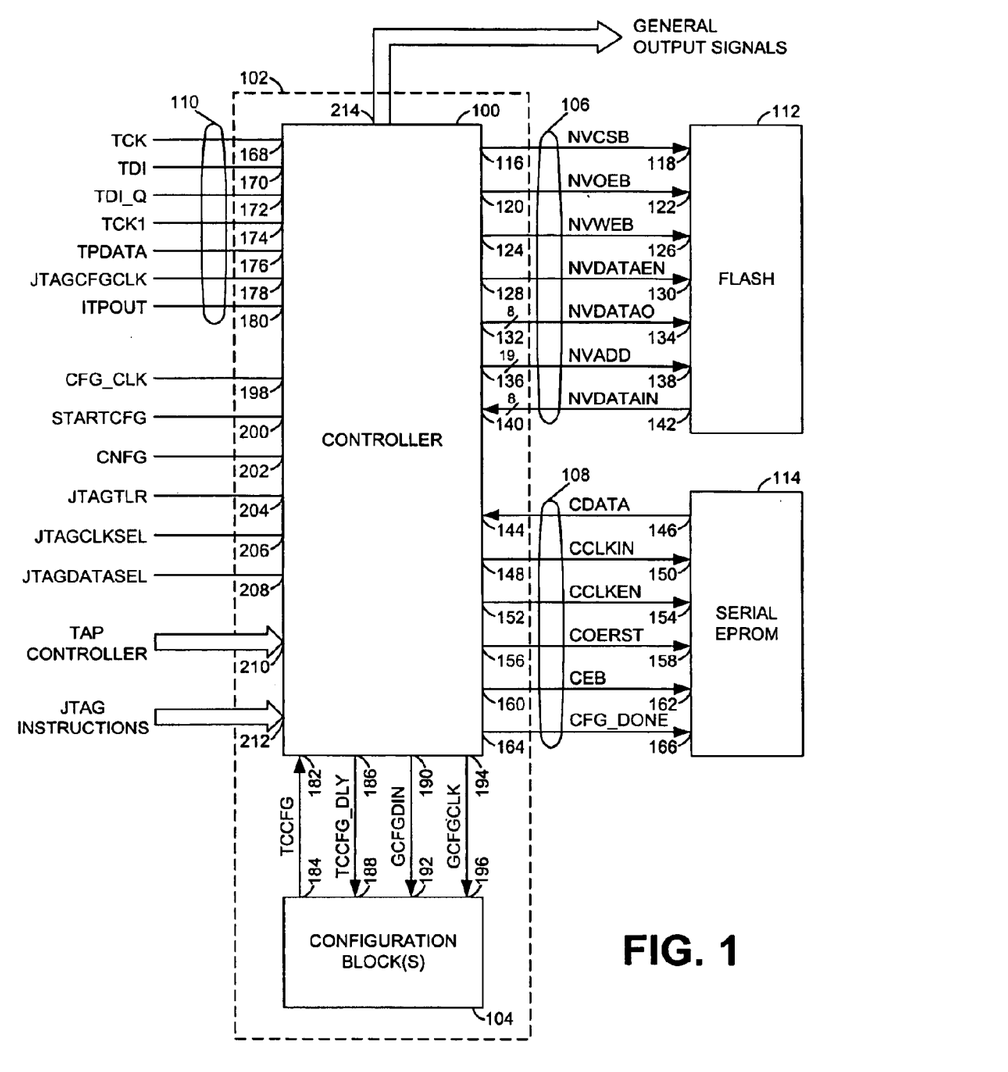
FIG. 1 is a block diagram illustrating a programmable logic device in accordance with the present invention.

Referring to FIG. 1, a block diagram of a circuit 100 is shown in accordance with a preferred embodiment of the present invention. The circuit 100 may be, in one example, a configuration controller circuit of a programmable logic device (PLD) 102. In one example, the PLD 102 may be configured in response to a number of configuration bits. The configuration bits may be organized into one or more configuration blocks 104. The PLD 102 may be configured, in one example, from a parallel port 106, a serial port And 108, or a JTAG port 110. In one example, the parallel port 106 may be connected to a non-volatile flash memory device 112 and the serial port 108 may be connected to a serial erasable programmable read only memory (EPROM) 114.

The circuit 100 may implement the parallel port 106, in one example, comprising an output 116 that may present a signal (e.g., NVCSB) to an input 118 of the circuit 112, an output 120 that may present a signal (e.g., NVOEB) to an input 122 of the circuit 112, an output 124 that may present a signal (e.g., NVWEB) to an input 126 of the circuit 112, an output 128 that may present a signal (e.g., NVDATAEN) to an input 130 of the circuit 112, an output 132 that may present a signal (e.g., NVDATAO) to an input 134 of the circuit 112, an output 136 that may present a signal (e.g., NVADD) to an input 138 of the circuit 112, and an input 140 that may receive a signal (e.g., NVDATAIN) from an output 142 of the circuit 112.

The circuit 100 may implement the serial port 108, in one example, comprising an input 144 that may receive a signal (e.g., CDATA) from an output 146 of the circuit 114, an output 148 that may present a signal (e.g., CCLKIN) to an input 150 of the circuit 114, an output 152 that may present a signal (e.g., CCLKEN) to an input 154 of the circuit 114, an output 156 that may present a signal (e.g., COERST) to an input 158 of the circuit 114, an output 160 that may present a signal (e.g., CEB) to an input 162 of the circuit 112, and an output 164 that may present a signal (e.g., CFG_DONE) to an input 166 of the circuit 114.

The circuit 100 may implement the JTAG port 110 comprising, in one example, an input 168 that may receive a signal (e.g., TCK), an input 170 that may receive a signal (e.g., TDI), an input 172 that may receive a signal (e.g., TDI_Q), an input 174 that may receive a signal (e.g., TCK1), an input 176 that may receive a signal (e.g., TPDATA), an input 178 that may receive a signal (e.g., JTAGCFGCLK), and an input 180 that may receive a signal (e.g., ITPOUT).

The circuit 100 may have an input 182 that may receive a signal (e.g., TCCFG) from an output 184 of the configuration blocks 104, an output 186 that may present a signal (e.g., TCC_DLY) to an input 188 of the configuration blocks 104, an output 190 that may present a signal (e.g., GCFGDIN) to an input 192 of the configuration blocks 104, and an output 194 that may present a signal (e.g., GCFGCLK) to an input 196 of the configuration blocks 104, an input 198 that may receive a signal (e.g., CFG_CLK), an input 200 that may receive a signal (e.g., STARTCFG), an input 202 that may receive a signal (e.g., CNFG), an input 204 that may receive a signal (e.g., JTAGTLR), an input 206 that may receive a signal (e.g., JTAGCLKSEL), an input 208 that may receive a signal (e.g., JTAGDATASEL), an input 210 that may receive a number of signals (e.g., GBSSHFTDR, UPDTDRSEL, CAPDR, NVP_RTI_WE, etc.) from a TAP controller, an input 212 that may receive a number of signals (e.g., SHFTNVCTL, SHFTNVARDR, FLASH_PGM, FLASH_RD, FLASH_VFY, FLASH_SDPARDR, FLASH_SDP1, FLASH_SDP2, FLASH_SDP3, etc.) that may indicate execution of a JTAG instruction, and a number of outputs that may present a number of signals (e.g., SDP1OUT, SDP2OUT, SDPARDROUT, NVCTLOUT, NVOUT, CLKINTEN, RE_CFG, CFG_CLKSEL, etc.).

The various signals may be implemented, in one example, as summarized in the following TABLE 1:

TABLE 1

| Name | I/O | Description |
|---|---|---|
| GENERAL | | |
| SDP1OUT | Output | LSB of Flash_sdp1 register |
| SDP2OUT | Output | LSB of Flash_sdp2 register |
| SDPARDROUT | Output | LSB of Flash_sdp3 register. |
| NVCTLOUT | Output | LSB of the non volatile control register |
| NVOUT | Output | LSB of the non volatile address register |
| CLKINTEN | Output | Configuration clock enable |
| RE_CFG | Output | Re-configure CPLD when a CRC error is detected |
| CFG_CLKSEL | Output | Select configuration port clock; TCK or CLKINT |
| CFG_CLK | Input | Configuration clock |
| STARTCFG | Input | Start configuration |
| CNFG | Input | Selects configuration mode: FLASH = 0; EEPROM = 1 |
| JTAGTLR | Input | Indicates that the TAP controller is in the TLR state |
| JTAGCLKSEL | Input | Mux select control for global internal config clock GCFGCLK |
| JTAGDATASEL | Input | Mux select control for global internal config data GCFGDIN |
| FLASH | | |
| NVCSB | Output | Used for accessing the internal non-volatile device |
| NVOEB | Output | Used for enabling the output drivers of the non-volatile device |
| NVWEB | Output | Used for reading/writing to the non-volatile device |
| NVDATAEN | Output | Used for enabling the data output drivers of the PLD 102 |
| NVDATAO [7:0] | Output | 8 bits of output data for the non-volatile device |
| NVADD [18:0] | Output | 19-bits of address for the non-volatile device |
| NVDATAI [7:0] | Input | 8 bits of input data for the non-volatile device |
| CPLD | | |
| GCFGDIN | Output | Internal configuration data for all the blocks |
| GCFGCLK | Output | Internal configuration clock. Clocks the address counters and registers the config. Data |
| TCCFG_DLY | Output | Delayed TCCFG |
| TCCFG | Input | Terminal done signal from the last block being configured, indicates end of configuration |
| SERIAL EPROM | | |
| CCLKI | Output | EPROM clock |
| CCLKEN | Output | Enables, cclki during serial modes |
| COERST | Output | Controls the output enable/reset pin of the |
| CEB | Output | Used to select the serial EEPROM for operation |
| CFG_DONE | Output | Indicates the end of configuration |
| CDATA | Input | Configuration data for volatile device |

TABLE 1-continued

| Name | I/O | Description |
|---|---|---|
| JTAG | | |
| TCK | Input | Positive test clock for the test logic |
| TCK1 | Input | Negative Test clock for the test logic |
| TDI | Input | Test Data Input |
| TDI_Q | Input | Registered version of TDI |
| GBSSHFTDR | Input | Active during the shift-dr state of the tap controller |
| UPDTDRSEL | Input | Active during the update-dr state of the tap controller |
| SHFTNVCTL | Input | Decodes shift NV_CTL instruction |
| SHFTNVARDR | Input | Decodes shift NV_AR_DR instruction |
| TPDATA | Input | Test Port Data |
| JTAGCFGCLK | Input | Gated Clock ~ ((state == shift_dr) && (~TCK)) |
| JTPOUT | Input | Boundary scan register input |
| CAPDR | Input | Active during the Capture-DR of the JTAG TAP controller |
| NVP_RTI_WE | Input | Active during the Run Test Idle state of the JTAG TAP controller |
| FLASH-PGM | Input | Active during the JTAG Flash_program instruction |
| FLASH_RD | Input | Active during the JTAG Flash_read instruction |
| FLASH_VFY | Input | Active during the JTAG Flash_verify instruction |
| FLASH_SDPARDR | Input | Active during the JTAG Flash_ShiftSDPARDR instruction |
| FLASH_SDP1 | Input | Active during the JTAG Flash_SDP1 instruction |
| FLASH_SDP2 | Input | Active during the JTAG Flash_SDP2 instruction |
| FLASH_SDP3 | Input | Active during the JTAG Flash_SDP3 instruction |

The circuit 100 may have a number of modes. In a first mode (e.g., a master serial mode), the circuit 100 may (i) supply a number of control signals as well as a clock signal to the serial EPROM 114 and (ii) receive data from the serial EPROM 114 one bit at a time. In addition, data stored in the serial EPROM 114 may be compressed. In one example, the data may be compressed using Huffman coding. The circuit 100 may handshake with the serial EPROM to start and stop a data transfer during the decompression stage of a configuration operation.

In a second mode, (e.g., a non-volatile configuration mode), the circuit 100 may communicate with the flash memory 112 via a number of dedicated pads. The pads may be connected to address, data and control signals of the flash memory 112 to allow the circuit 100 to load configuration data from the flash memory 112. Similarly to the serial EPROM 114, the data stored in the flash memory may be compressed. During the non-volatile configuration mode, the circuit 100 may read from the flash memory whenever data is needed during the decompression stage of the configuration.

In a third mode, the PLD 102 may also be configured through the JTAG port 110 by loading a load-configure instruction. In a shift-DR state of the JTAG TAP controller, configuration data may be shifted into the TDI pin in response to the clock signal TCK. The configuration data in this mode may be un-compressed.

The master serial and non-volatile configuration modes may be referred to as self-configuration modes. The self-configuration may be initiated, in one example, (i) automatically after power-up of the system, (ii) by toggling the signal STARTCFG, in one example, from a low state to a high state, and/or (iii) by issuing an IEEE std. 1149.1 (JTAG) self configuration initiate instruction. In general, each method for initiating the configuration process may have an equal priority. However, the JTAG self configuration initiate instruction may be used to re-start the configuration process. In response to the initiation of self-configuration, the circuit 100 may be configured to (i) sense the state of the signal CNFG, (ii) decode the chosen configuration method, and (iii) enable the appropriate internal circuitry to load the configuration data into the configuration block(s) of the PLD 102. The configuration data may be read, for example, from either an EEPROM, a FLASH device, or other appropriate means of storing the configuration data. The data may be decompressed using, in one example, a Huffman code decompression. However, the circuit 100 may be configured to decompress configuration data using any other compression method to meet the design criteria of a particular application.

The circuit 100 may be configured to check the validity of received data. In one example, a two byte cyclic redundancy check (CRC) at the end of each 1024 byte packet of compressed data may provide 100% coverage for single and double bit errors. The CRC data generally adds only a 0.2% increase in the amount of data.

The PLD 102 may comprise a JTAG TAP controller. The JTAG TAP controller may be placed in a test-logic-reset (TLR) state for the self configuration to proceed. A change of the JTAG TAP controller state from the TLR state may cause self configuration to be aborted.

A first byte of the configuration data may be reserved for a debug and test configuration byte (DTCB). The circuit 100 may be configured to extract the DTCB byte. In one example, an even parity logic circuit may (i) check the DTCB and (ii) restart configuration if an error is detected. However, other appropriate circuits may be implemented accordingly to meet the design criteria of a particular application. The bit definitions of the DTCB byte may be summarized as in the following TABLE 2:

TABLE 2

| Bit | Description |
| --- | --- |
| 0 | A "0" may enable CRC checking; A "1" may disable CRC checking. |
| 1 | A "0" may select a 1024 byte packet; A "1" may select a 2 byte packet. |
| 2 | A "0" may select an internal ring oscillator clock; A "1" may select the signal TCK. |
| 3 | A "1" may output EEPROM debug signals as the signals CCLKI and COERST. |
| 4 | Number of wait states bit #0. |
| 5 | Number of wait states bit #1. |
| 6 | Even parity bit. |
| 7 | Undefined. |

In one example, the DTCB byte may have a default value (e.g., h30) that may program the circuit 100 for (i) 3 wait states, (ii) CRC checking enabled, and (iii) a 1024 byte packet.

In general, a configuration time of the PLD 102 may be varied by programming a different number of wait states. The number of wait states may be selected, for example, to support slower storage devices. The configuration time will generally increase as wait states are added.

In one example, the compressed data retrieved from the memory devices 112 and 114 may have the following compressed data format:

[1st byte is the DTCB] [1024 bytes of compressed data] [2 bytes of CRC].

Figure 2:
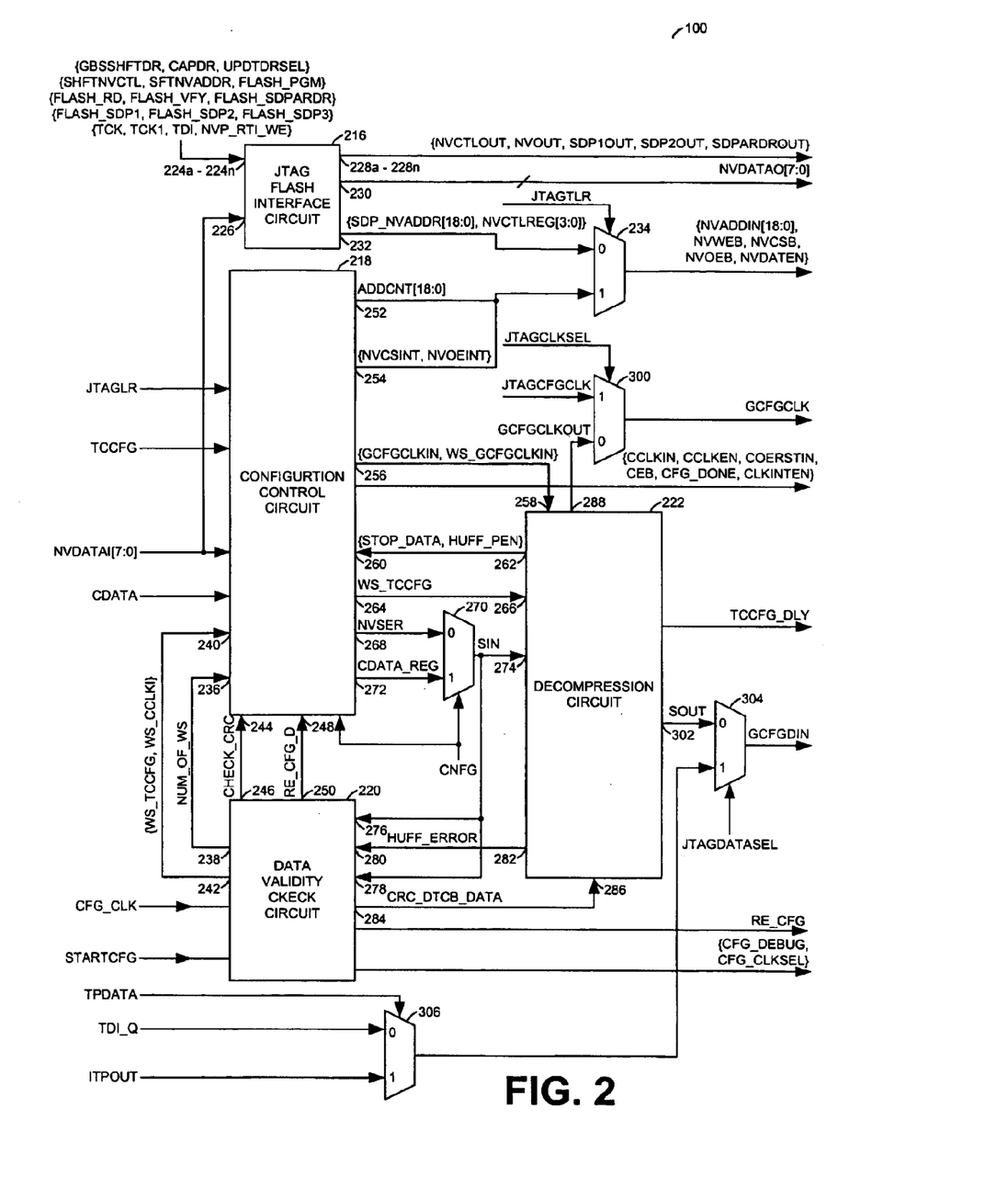
FIG. 2 is a detailed block diagram illustrating a preferred embodiment of the present invention.

Referring to FIG. 2, a more detailed block diagram of the circuit 100 illustrating a preferred embodiment of the present invention is shown. The circuit 100 may comprise a circuit 216, a circuit 218, a circuit 220, and a circuit 222. The circuit 216 may be implemented as a JTAG to flash interface circuit. The circuit 218 may be implemented as a configuration control circuit. The circuit 220 may be implemented as a data validity check circuit. The circuit 222 may be implemented as a decompression circuit.

The circuit 216 may have (i) a number of inputs 224a–224n that may receive the signals GBSSHFTDR, UPDTDRSEL, CAPDR, NVP_RTI_WE, SHFTNVCTL, SHFTNVARDR, FLASH_PGM, FLASH_RD, FLASH_VFY, FLASH_SDPARDR, FLASH_SDP1, FLASH_SDP2, FLASH_SDP3, TCK, TCK1, and TDI, (ii) an input 226 that may receive the signal NVDATAI[7:0], (iii) a number of outputs 228a–228n that may present the signals NVCTLOUT, NVOUT, SDP1_OUT, SDP2_OUT, and SDPARDROUT, (iv) an output 230 that may present the signal NVDATAO[7:0], and (v) an output 232 that may present a signal (e.g., SDP_NVADDR[18:0]) and a signal (e.g., NVCTLREG[3:0]) to a first input of a multiplexer 234. The circuit 216 may comprise, in one example, four 19-bit address registers, four 8-bit data registers. four 1-bit control registers and support logic for nine JTAG instructions that may be used for programming and reading from the FLASH Device 112.

The signals JTAGTLR, TCCFG, NVDATAI [7:0], CNFG, and CDATA may be presented to inputs of the circuit 218. The circuit 218 may be configured to present the signals CCLKIN, CCLKEN, COERSTIN, CEB, CFG_DONE, and CLKINTEN. The circuit 218 may have an input 236 that may receive a signal (e.g., NUM_OF_WS) from an output 238 of the circuit 220, an output 240 that may present a number of signals (e.g., WS_TCCFG and WS_CCLKI) to an input 242 of the circuit 220, an input 244 that may receive a signal (e.g., CHDCK_CRC) from and output 246 of the circuit 220, an input 248 that may receive a signal (e.g., RE_CFG_D) from an output 250 of the circuit 220, an output 252 that may present a signal (e.g., ADDCNT[18:0]), an output 254 that may present a number of signals (e.g., NVCSINT and NVOEINT), an output 256 that may present a number of signals (e.g., GCFGCLKIN and WS_GCFGCLKIN) to an input 258 of the circuit 222, an input 260 that may receive a number of signals (e.g., STOP_DATA and HUFF_PEN) from an output 262 of the circuit 222, an output 264 that may present a signal (e.g., WS_TCCFG) to an input 266 of the circuit 222, an output 268 that may present a signal (e.g., NVSER) to a first input of a multiplexer 270, and an output 272 that may present a signal (e.g., CDATA_REG) to a second input of the multiplexer 270.

The signals ADDR[18:0], NVCSINT, and NVOEINT may be present to a second input of the multiplexer 234. The signal JTAGTLR may be presented to a control input of the multiplexer 234. The multiplexer 234 may have an output that may present the signals NVADDIN[18:0], NVWEB, NVCSB, NVOEB, and NVDATEN.

The signal CNFG may be presented to a control input of the multiplexer 270. The multiplexer 270 may have an output that may present a signal (e.g., SIN) to an input 274 of the circuit 222 and inputs 276 and 278 of the circuit 220. The multiplexer 270 may select either the signal NVSER or the signal CDATA_REG as the signal SIN in response to the signal CNFG.

The signals associated with the configuration control block 218 may be defined, in one example, as summarized in the following TABLE 3:

TABLE 3

| Name | I/O | Description |
|---|---|---|
| GENERAL | | |
| CLKINTEN | Output | Configuration clock enable |
| CFG_CLK | Input | Configuration clock |
| STARTCFG | Input | Start configuration |
| STOP_DATA | Input | Wait for the uncompressed data to be shifted out |
| CNFG | Input | Selects modes of configuration |
| JTAGTLR | Input | Indicates that the tap controller is in the TLR state |
| HUFF_PEN | Input | Huffman shift data pending |
| NUM_OF_WS | Input | Number of Wait States |
| FLASH | | |
| NVSER | Output | Serial data from the FLASH |
| NVCSINT | Output | Used for accessing the internal non-volatile device |
| NVOEINT | Output | Used for enabling the output drivers of the non-volatile device |
| ADDCNT [18:0] | Output | 19-bits of address for the non-volatile device |
| NVDATAI [7:0] | Input | 8 bits of input data for the non-volatile device. |
| CPLD | | |
| GCFGCLKIN | Output | Clocks the address counters and registers the configuration data |
| WS_GCFGCLKIN | Output | Wait State GCFGCLKIN clock |
| WS_TCCFG | Output | Wait State TCCFG |
| CHECK_CRC | Input | Active when checking the CRC |
| RE_CFG_D | Input | Unregistered RE_CFG |
| TCCFG | Input | Terminal count of the counter of the last block being configured. |
| TCCFG_DLY | Input | Delayed TCCFG |
| EEPROM | | |
| CCLKIN | Output | EEPROM clock |
| WS_CCLKIN | Output | Wait state CCLKIN |
| CCLKEN | Output | Enables CCLKI during serial modes |
| COERST | Output | Controls the output enable/reset pin of the EEPROM |
| CEB | Output | Used to select the serial EEPROM for operation |
| CFG_DONE | Output | Indicates the end of configuration |
| CDATA_REG | Output | Output data from volatile device register |
| CDATA | Input | Configuration data for volatile device |

However, other definitions for the signals in TABLE 3 may be implemented to meet the design criteria of a particular application.

The signals CFG_CLK and STARTCFG may be presented to the circuit 220. The circuit 220 may have an input 280 that may receive a signal (e.g., HUFF_ERROR) from an output 282 of the circuit 222 and an output 284 that may present a signal (e.g., CRC_DTCB_DATA) to an input 286 of the circuit 222. The circuit 220 may be configured to generate the signals NUM_OF_WS, CRC_DTCB_DATA, RE_CFG, CFG_DEBUG, and CFG_CLKSEL in response to one or more of the signals CFG_CLK, STARTCFG, WS_TCCFG, WS_CCLKI, SIN, and HUFF_ERROR.

The signals associated with the circuit 220 may be defined, in one example, as summarized in the following TABLE 4:

TABLE 4

| Name | I/O | Description |
|---|---|---|
| GENERAL | | |
| RE_CFG | Output | Re-configure CPLD when a CRC error is detected |

TABLE 4-continued

| Name | I/O | Description |
|---|---|---|
| RE_CFG_D | Output | Unregistered RE_CFG |
| CRC_DTCB_DATA | Output | Active when the CRC data is being received |
| CFG_CLKSEL | Output | Select the configuration port clock; either CLKINT or TCK |
| CFG_DEBUG | Output | Output the signals SIN and GCFGCLKIN as the signals CCLKI and COERST, respectively |
| CHECK_CRC | Output | Active when checking the CRC |
| NUM_OF_WS | Output | Number of Wait States |
| CFG_CLK | Input | Configuration clock generated internally |
| WS_CCLKIN | Input | EEPROM clock |
| STARTCFG | Input | Start configuration |
| SIN | Input | Serial data in that is checked for CRC errors |
| HUFF_ERROR | Input | Huffman coding error |
| WS_TCCFG | Input | Terminal count of the counter of the last block being configured |

However, other definitions for the signals in TABLE 4 may be implemented to meet the design criteria of a particular application.

The circuit 220 may perform a CRC error check, in one example, on 1024 bytes of compressed data using the following 16 bit CRC polynomial taken from the USB specification version 1.0 (published November 1996):

$$G(X) = X^{16} + X^{15} + X^2 + 1$$

The CRC may provide 100% coverage for all single and double bit errors (e.g., see USB specification 1.0; section 8.3.5, published November 1996). There is generally no CRC error checking on configuration data written into the PLD 102 from the JTAG interface. However, CRC checking of data from the JTAG interface may be implemented to meet the design criteria of a particular application.

In one example, the compressed data may be divided up into 1024 byte packets with the 16 bit CRC at the end of the packet. A counter may track the packet length to determine when to decompress the data versus checking for the CRC error. Detection of a CRC error may pulse the signal RE_CFG active HIGH and restart configuration from the beginning. The signal CFG_DONE may remain inactive and the circuit 100 may continue the configuration/reconfiguration process until all configuration data is loaded without a CRC error.

The circuit 220 may comprise a debug and test configuration byte (DTCB) logic circuit. The DTCB logic may be configured to extract the DTCB from a first byte of the configuration bit stream. An even parity checker may ensure that the DTCB is loaded with no errors. A parity error will generally restart configuration. Other types of data validity checks may be implemented to meet the design criteria of a particular application.

In one example, the configuration data may need to be stuffed with zeros from the last compressed bit to the end of the 1024 byte packet. The added zeros may insure that the CRC logic knows where to check the CRC. The zeros will generally be ignored by the decompression logic since it is disabled after the signal TCCFG is asserted.

The circuit 222 may have an output 288 that may present a signal (e.g., GCFGCLKOUT) to a first input of a multiplexer 300 and an output 302 that may present a signal (e.g., SOUT) to a first input of a multiplexer 304. The circuit 222 may be configured to generate the signals TCCFG_DLY, GCFGCLKOUT, SOUT, STOP_DATA, HUFF_PEN, and HUFF_ERROR in response to one or more of the signals GCFGCLKIN, WS_GCFGCLKIN, WS_TCCFG, SIN, and CRC_DTCB_DATA.

The signals associated with the circuit 222 may be defined, in one example, as summarized in the following TABLE 5:

TABLE 5

| General | I/O | Description |
|---|---|---|
| STOP_DATA | Output | Wait for the uncompressed data to be shifted out |
| HUFF_ERROR | Output | Huffman coding error |
| HUFF_PEN | Output | Huffman shift data pending |
| TCCFG_DLY | Output | Delayed TCCFG |
| CFG_CLK | Input | Configuration clock |
| STARTCFG | Input | Start configuration |
| CRC_DTCB_DATA | Input | Active when the CRC data is being received |
| WS_TCCFG | Input | Terminal count of the counter of the last block being configured |
| CPLD CORE | | |
| GCFGCLKOUT | Output | CPLD configuration clock |
| SOUT | Output | Uncompressed serial data to the PLD 102 |
| SIN | Input | Serial data from the FLASH device or EEPROM |
| GCFGCLKIN | Input | Clocks the address counters and registers the configuration data |
| WS_GCFGCLKIN | Input | Wait State GCFGCLKIN |

However, other signal definitions may be implemented to meet the design criteria of a particular application.

The signals JTAGCFGCLK and JTAGCLKSEL may be presented to a second input and a control input of the multiplexer 300, respectively. The multiplexer 300 may have an output that may present either the signal JTAGCFGCLK or the signal GCFGCLKOUT as the signal GCFCLK in response to the signal JTAGCLKSEL.

A multiplexer 306 may have a first input that may receive the signal TDI_Q, a second input that may receive the signal ITPOUT, a control input that may receive the signal TPDATA, and an output that may present a signal to a second input of the multiplexer 304. The multiplexer 304 may have an output that may present the signal SOUT, the signal TDI_Q, or the signal ITPOUT as the signal GCFGDIN in response to the signals TPDATA and JTAGDATASEL.

Figure 3:
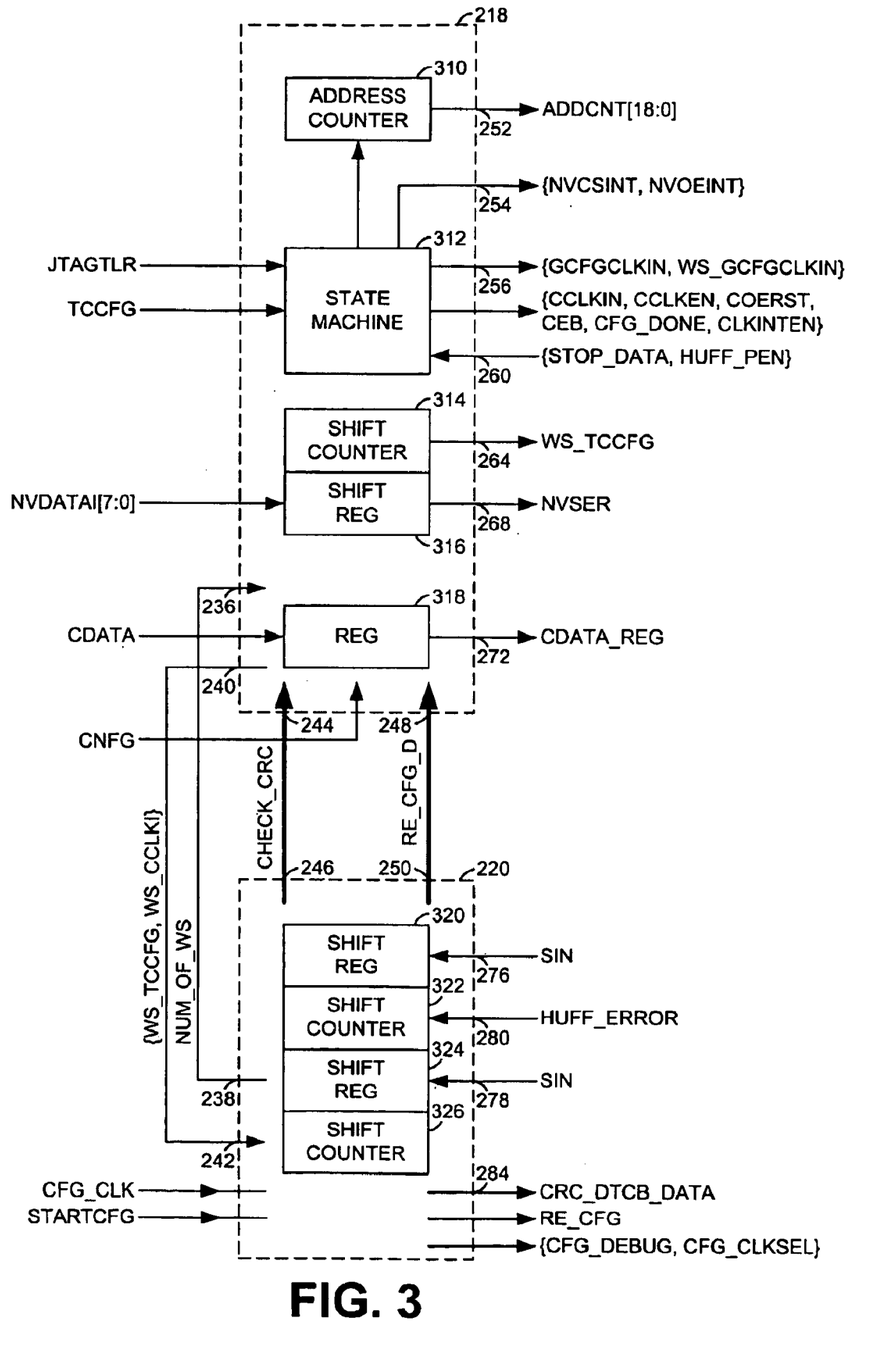
FIG. 3 is a more detailed block diagram illustrating a configuration control circuit and data validity checking circuit of FIG. 2.

Referring to FIG. 3, a more detailed block diagram illustrating the circuits 218 and 220 of FIG. 2 is shown. The circuit 218 may comprise, in one example, an address counter 310, a state machine 312, a shift counter 314, a shift register 316, and a register 318. The address counter 310 may be configured to generate the signal ADDRCNT. The signal ADDRCNT may be used as the FLASH address signal NVADDIN. The address counter 310 may be controlled by the state machine 312. The shift register 316 may store, in one example, eight bits of FLASH data. The shift register 316 may be used for parallel to serial conversion of the FLASH data. The register 318 may store, in one example, one bit of EEPROM data. The circuit 218 may be configured to (i) control reading from the EEPROM or FLASH memory devices, (ii) generate the signal GCFGCLKIN, (iii) control the flow of data into the decompression circuit 222, and (iv) generate the signals NVADD, NVCSB, NVOEB, NVWEB, CLKI, COERST, CEB and CFG_DONE during normal configuration and self configuration modes.

The signal COERST may be used to control an output enable/reset pin of a serial configuration storage device. A first logic level (e.g., a logic HIGH, or "1") may reset the address pointer in the serial configuration storage device and a second logic level (e.g., a logic LOW, or "0") may enable the data output and permit the address counter to increment in the storage device. The signal CFG_DONE may be used to indicate the end of configuration. The signal CFG_DONE may be, in one example, driven LOW at the beginning of configuration and HIGH when the registered terminal count TCCFG transitions HIGH. The signal CEB may be used to select the serial EEPROM for operation. The signal CEB may be driven LOW at the beginning of configuration and set HIGH after all bits are configured as indicated by a HIGH transition of the signal TCCFG. The signal CLKI may be used to increment the EEPROM address counter. The compressed data stored in the serial EEPROM may have fewer total bits than the PLD 102 has configuration registers. To compensate for a difference in bit rate between data received from the EEPROM and data sent to the PLD 102, the state machine 312 may halt the data transfer from the EEPROM periodically by not toggling the signal CLKI.

When the non-volatile mode of the PLD 102 is selected, the signals NVCSB and NVOEB may be driven active LOW and the signal NVWEB may be driven inactive HIGH during configuration. However, other signal polarities may be implemented to meet the design criteria of a particular application. When the address counter of the last configuration block 104 being configured reaches the final count, the signals NVCSB and NVOEB may be set, in one example, to an inactive HIGH state.

The circuit 220 may comprise a shift register 320, a shift counter 322, a shift register 324, and a shift counter 326. The signal SIN may be presented to the shift registers 320 and 324. The signal HUFF_ERROR may be presented to the shift counter 322. The shift register 324 may present the signal NUM_OF_WS. The signals WS_TCCFG and WS_CCLKI may be presented to the shift counter 326.

The EEPROM/FLASH read cycle time may be increased for slow storage devices by programming bits #4 & #5 of the DTCB with data representing the number of waits states desired. The wait state logic may hold the next state of the state machine 312 for the specified number of wait states. Increasing the number of wait states may increase the read cycle timing and the configuration time.

The circuit 100 may read the DTCB using the slowest device timings. The number of wait states may then be changed to the DTCB[5:4] value once the DTCB is loaded.

Figure 4:
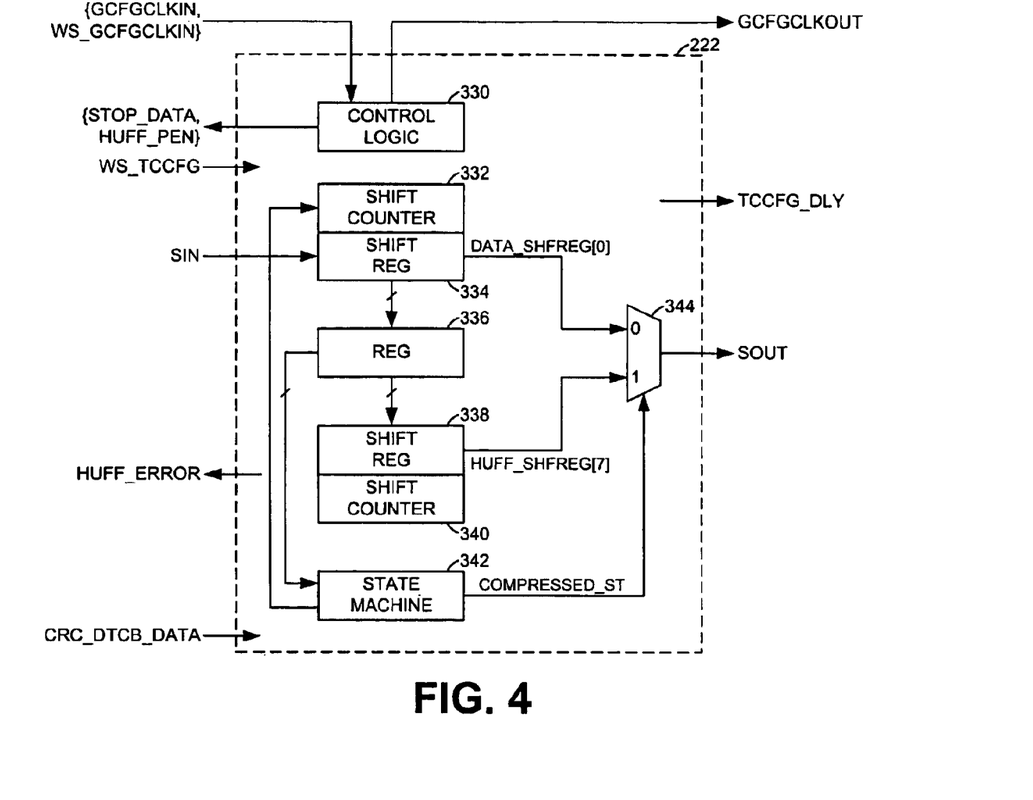
FIG. 4 is a block diagram illustrating a decompression circuit of FIG. 2.

Referring to FIG. 4, a more detailed block diagram of the circuit 222 of FIG. 2 is shown. The circuit 222 may comprise, in one example, a control logic block 330, a data shift counter 332, a data shift register 334, a Huffman code register 336, a Huffman code shift register 338, a Huffman code shift counter 340, a state machine 342, and a multiplexer 344.

The signals GCFGCLKIN and WS_GCFGCLKIN may be presnted to the control logic block 330. The control logic block may be configured to generate the signals GCFGCLKOUT, STOP_DATA, and HUFF_PEN in response to the signals GCFGCLKIN and WS_GCFGCLKIN. The signal SIN may be presented to the shift register 334. The shift register 334 may present a parallel or multi-bit signal to an input of the register 336 and a serial signal (e.g., DATA_SHFREG[0]) to a first input of the multiplexer 344. The register 336 may present a first parallel or multi-bit signal to an input of the shift register 338 and a second parallel or multi-bit signal to an input of the state machine 342. The shift register 338 may present a signal (e.g., HUF_SHFREG[7]) to a second input of the multiplexer 344. The state machine 342 may present a first signal to an input of the shift counter 332 and a second signal (e.g., COMPRESSED_ST) to a control input of the multiplexer 344. The multiplexer 344 may select the signal DATA_SHFREG[0] or the signal HUFF_SHFREG[7] as the signal SOUT in response to the signal COMPRESSED_ST.

The circuit 222 may be configured to perform the Huffman decompression operation. The Huffman codes will generally match any input data pattern. In general, there is no such thing as a Huffman coding error. An error in the bit stream may cause a different uncompressed data output and a CRC error. However, the data will generally always decompress to some pattern.

The shift register 334 may be used for serial to parallel conversion. The parallel data may be used to match the Huffman code. Compressed data may be shifted into the shift register 334 and uncompressed data may be shifted out from the shift register 338 (Huffman code shift register) at the same time. Uncompressed data shifted into the shift register 334 may be also shifted out from the shift register 334. One to six wait states may be added for transitions from uncompressed data to compressed data. One to six bits of data shifted into the shift register 334 may determine the Huffman code. This delay may be hidden for compressed data because eight bits of uncompressed data is shifted out of the shift register 338 at the same time one to six bits of compressed data is shifted into the shift register 334.

The data shift counter 332 may be used to count the number of bits shifted into the shift register 334. The count may be used by the Huffman code logic to determine a match. The counter 332 may also determine when 8 or 1024 bits of uncompressed data (or 1024 bits of zeros) are shifted out of the shift register 334. The Huffman code logic may be configured to generate 8 bits of uncompressed data when there is a match to the compressed data in the shift register 334.

The shift register 338 (Huffman code shift register) may be used, in one example, for parallel to serial conversion of the 8 bits uncompressed Huffman code. The counter 340 (Huffman shift counter) may be used to count the number of bits shifted out of the shift register 338.

The state machine 342 may be configured to control the shifting of the uncompressed data or zeros.

The bit stream SIN may be compressed with a Huffman code. The following TABLE 4 illustrates various codes that may be received in the compressed bit stream and a data pattern that each code may represent.

TABLE 4

| Index | Code | Pattern |
|---|---|---|
| 1 | 1 | 00000000 |
| 2 | 10 | No pattern (8 uncompressed bits) |
| 3 | 100 | 11111111 |
| 4 | 00000 | 00000001 |
| 5 | 111000 | 00000010 |
| 6 | 011000 | 00000100 |
| 7 | 101000 | 00001000 |
| 8 | 001000 | 11111110 |
| 9 | 110000 | 01111111 |
| 10 | 1010000 | 11111101 |
| 11 | 10010000 | No pattern (1024 uncompressed bits) |
| 12 | 00010000 | 1024 zeros |

However, the bit stream SIN may be compressed using any appropriate compression method to meet the design criteria of a particular application.

Figure 5:
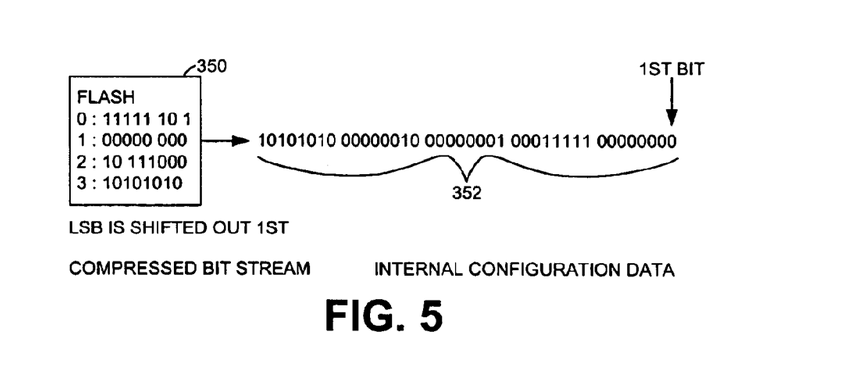
FIG. 5 is a diagram illustrating an example decompression operation in accordance with the present invention.

Referring to FIG. 5, a diagram illustrating an example decompression operation is shown. Compressed Huffman codes contained in a compressed bit stream (e.g., box 350) may be decompressed into a serial pattern (e.g., bit stream 352). The pattern may be presented to the core of the PLD 102. Configuration bits of the PLD 102 may be programmed in response to the decompressed bit stream.

Figure 6:
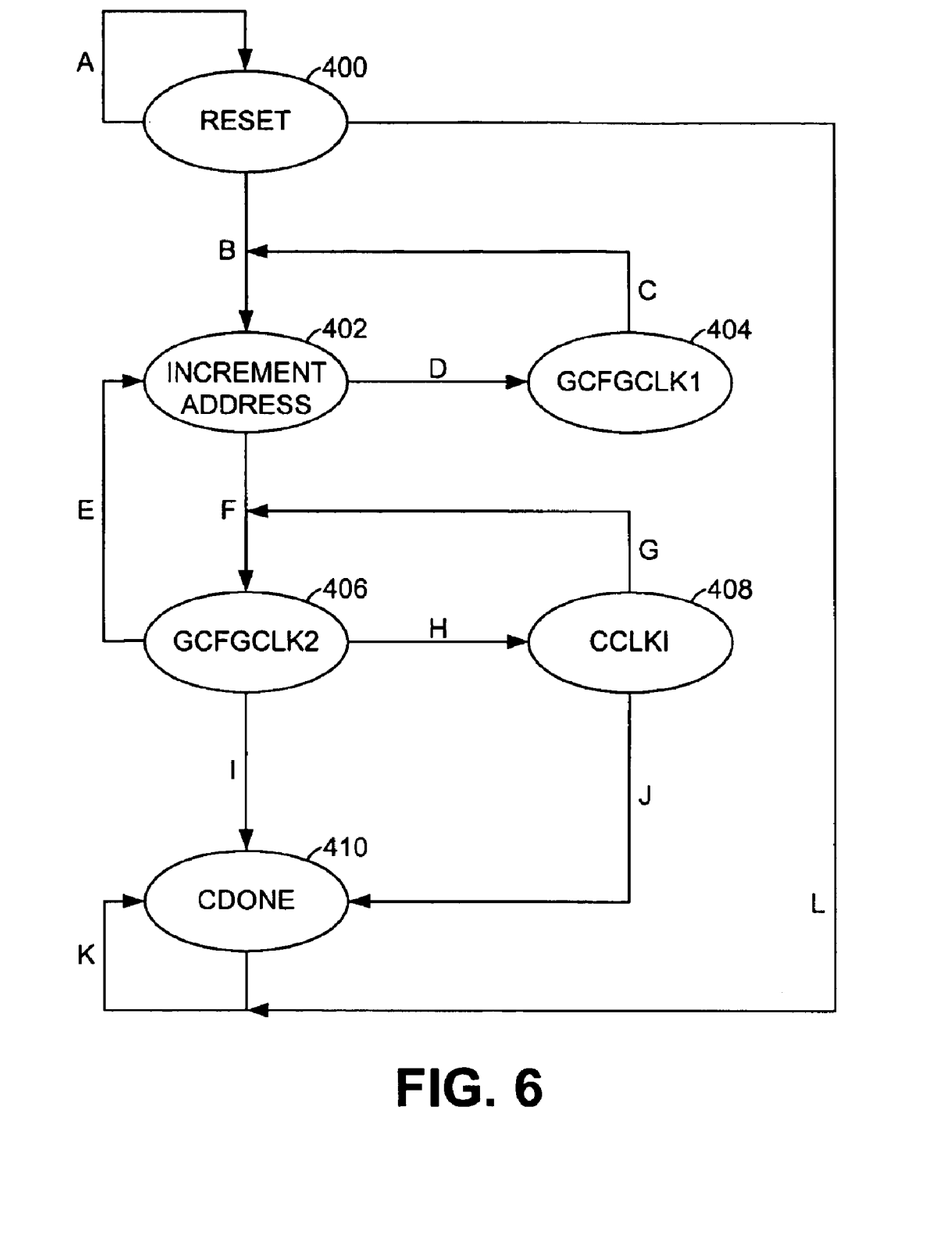
FIG. 6 is a state diagram illustrating an example operation of a configuration control state machine of FIG. 3.

Referring to FIG. 6, a state diagram illustrating an example operation of the configuration control state machine 312 of FIG. 3 is shown. The state machine 312 may have, in one example, a state 400, a state 402, a state 404, a state 406, a state 408, and a state 410. The state 400 may be a reset state. The state machine 312 may power up in the state 400. The state machine 312 may remain in the state 400, in one example, for 16 clock cycles after a rising edge of the signal STARTCFG (e.g., pathway A). The time delay (16 clocks) may provide for an initial memory access. When the state machine is in the state 400, the state machine 312 may be configured to drive all memory control signals to an inactive state while the signal STARTCFG is in an active state (e.g., a logic LOW, or "0"). The memory control signals may be in an active state during all others states except the state 410. When the 16 clock cycles have passed, the state machine 312 may move to the state 402 (e.g., pathway B). However, when the state machine 312 is in the state 400 and self configuration is terminated, the state machine 312 may move to the state 410 (e.g., pathway L). The state 402 may be an increment address state. When the state machine 312 is in the state 402, the FLASH address counter may be incremented, FLASH and EEPROM data may be loaded, and an input to a CCLKI register may be driven HIGH. The signal CCLKI may become active a clock cycle later. When the signal STOP_DATA is asserted, the state machine 312 may move from the state 402 to the state 404 (e.g., pathway D). When the signal STOP_DATA is not asserted, the state machine 312 may move from the state 402 to the state 406 (e.g., pathway F).

The state 404 may be a GCFGCLK1 state of the state machine 312. When the state machine 312 is in the state 404, an input to a GCFGCLK1 register may be driven HIGH. The signal GCFGCLK may become active a clock cycle later. The state machine 312 generally moves from the state 404 back to the state 402 (e.g., pathway C).

The state 406 may be a GCFGCLK2 state of the state machine 312. When the state machine 312 is in the state 406, the input to the GCFGCLK1 register may be driven HIGH. The signal GCFGCLK may be active a clock cycle later. When a flash data serial to parallel conversion is completed, the state machine 312 generally moves to the state 402 to increment the flash address (e.g., pathway E). Otherwise, the state machine 312 may move to the state 408 if self configuration is continuing (e.g., pathway H) or to the state 410 if self configuration is terminated (e.g., pathway I).

The state 408 may be a CCLKI state of the state machine 312. When the state machine 312 is in the state 408, an input to a CCLKI register may be driven HIGH, data may be loaded from an EEPROM, and FLASH data may be shifted. When self configuration is ongoing, the state machine 312 may move from the state 408 back to the state 406 (e.g., pathway G). However, if self configuration is terminated, the state machine 312 generally moves to the state 410 (e.g., pathway J).

The state 410 may be a CDONE state of the state machine 312. When the state machine 312 is in the state 410, the signal CFG_DONE may be driven to an active state (e.g., HIGH) and the signal CLKINTEN may be driven to an inactive state (e.g., LOW). The signal CLKINTEN may be used, in one example, as an enable signal to a ring oscillator that may clock the self configuration operation of the PLD 102. The state machine 312 may remain in the state 410 as long as the self configuration is terminated (e.g., pathway K). Self configuration may be terminated when the terminal count is reached (e.g., TCCFG asserted) or the JTAG interface is not in the TLR TAP controller state (e.g., JTAGTLR de-asserted).

Transitions of the state machine 312 from one state to another state may be summarized, in one example, as in the following TABLE 5:

TABLE 5

A  Wait 16 cycles of the clock CLKINTDIVX for the 1st memory access after the rising edge of the signal STARTCFG.
B  Transition to the state 402 after 16 cycles of the clock CLKINTDIVX and rising edge of the signal STARTCFG.
C  Transition to the state 402.
D  If the signal STOP_DATA is asserted, transition to the state 404; stop the clock signal CCLKI; do not increment the FLASH address counter 310; and wait for the uncompressed data to be shifted out of the shift register 318.
E  If FLASH serial to parallel conversion is complete (e.g., SHFTCNT == 7), increment the FLASH address by moving to the state 402.
F  If the signal STOP_DATA is not asserted, continue normal self configuration and transition to the state 406.
G  Self configuration is not terminated; transition to the state 406.
H  Self configuration is not terminated; transition to the state 408.
I  Self configuration is terminated; transition to the state 410.
J  Self configuration is terminated; transition to the state 410.
K  Self configuration is terminated; remain in the state 410.
L  Self configuration is terminated; transition to the "cdone" state where the letters correspond to the transition lines of FIG. 6.

Figure 7:
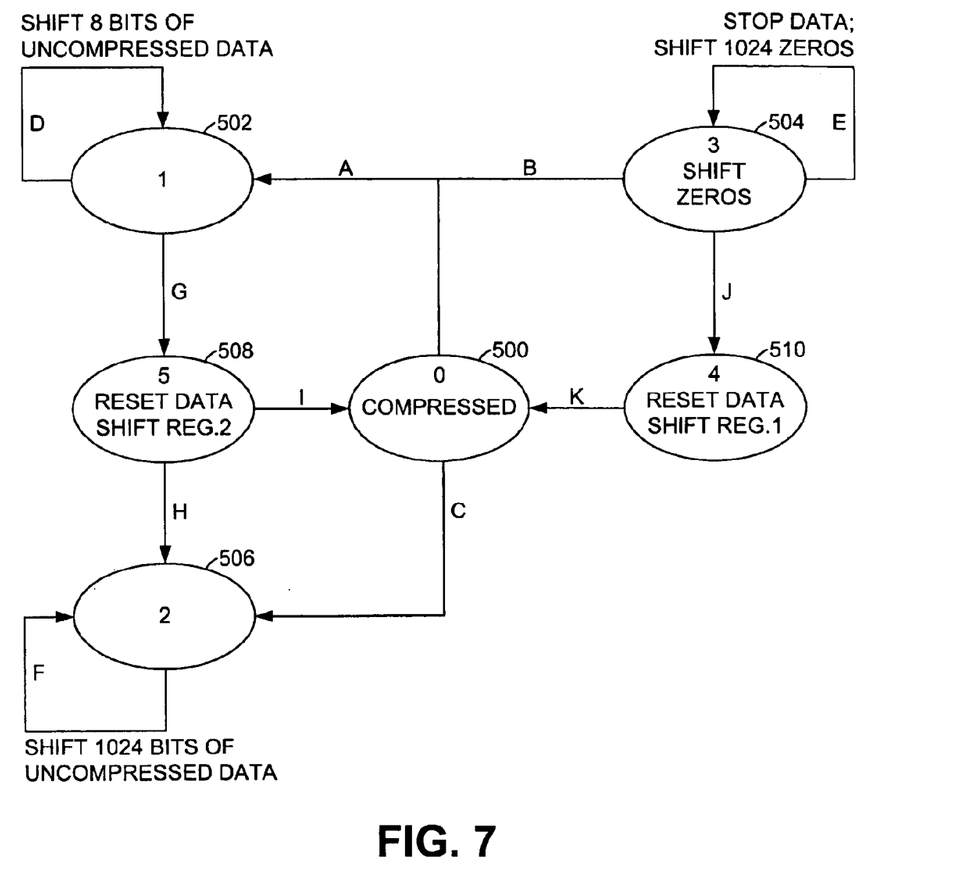
FIG. 7 is a state diagram illustrating an example operation of a decompression state machine of FIG. 4.

Referring to FIG. 7, a state diagram illustrating an example operation of the state machine 342 of FIG. 4 is shown. The state machine 342 may have a state 500, a state 502, a state 504, a state 506, a state 508, and a state 510. The state 500 may be implemented as a compressed data state. The state machine 342 generally starts and returns to the state 500. The state machine 342 may be in the state 500 when receiving compressed data. The state machine 342 may move from the state 500 to (i) the state 502 (e.g., pathway A), (ii) the state 504 (e.g., pathway B), or (iii) the state 506 (e.g., pathway C).

When the state machine 342 is in the state 502, the state machine 342 may count eight bits of uncompressed data. The state machine 342 generally remains in the state 502 until the data count is reached (e.g., pathway D). When the state machine 342 is in the state 504, the state machine 342 may count 1024 zeros and stop new uncompressed data from being shifted in. The state machine 342 generally remains in the state 504 until the count of zeros is reached (e.g., pathway E). When the state machine 342 is in the state 506, the state machine 342 may count 1024 bits of uncompressed data. The state machine 342 generally remains in the state 506 until the data count is reached (e.g., pathway F).

The state machine 342 may move to the state 508 from either the state 502 (e.g., pathway G) or the state 506 (e.g., pathway H). When the state machine 342 is in the state 508, the state machine 342 may reset the counts of shifted data. When the counts are reset, the state machine 342 generally moves from the state 508 to the state 500 (e.g., pathway I).

The state machine 342 may move from the state 504 to the state 510 (e.g., pathway J). When the state machine 342 is in the state 510, the state machine 342 may reset the counts of shifted zeros and stop new uncompressed data from being shifted in. When the counts are reset, the state machine 342 generally moves from the state 510 to the state 500 (e.g., pathway K).

Figure 8:
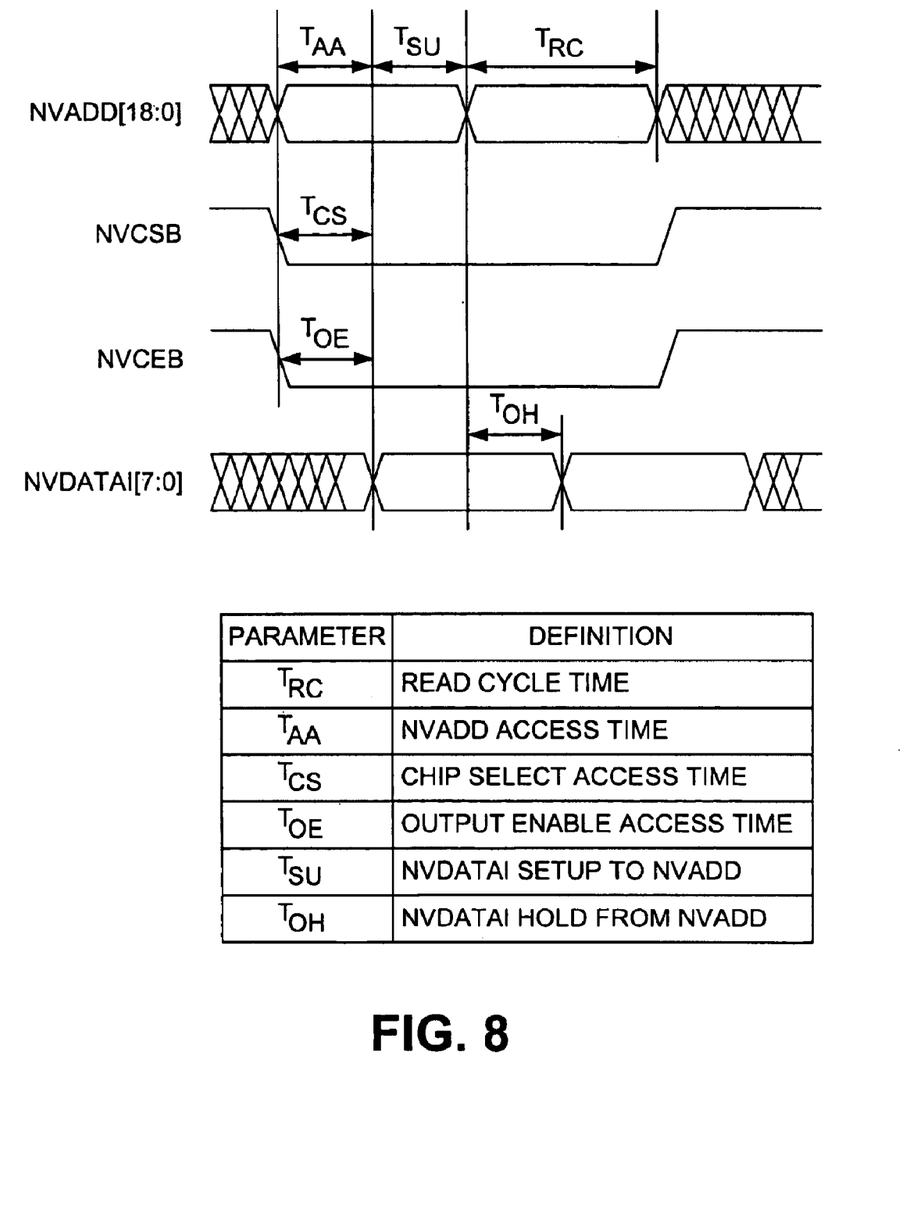
FIG. 8 is a timing diagram illustrating an example self configuration operation of the apparatus of FIG. 2.

Referring to FIG. 8, a timing diagram illustrating an example read operation of the flash memory device 112 is shown. Various timing parameters of a read cycle of the flash memory may be related as shown.

Figure 9:
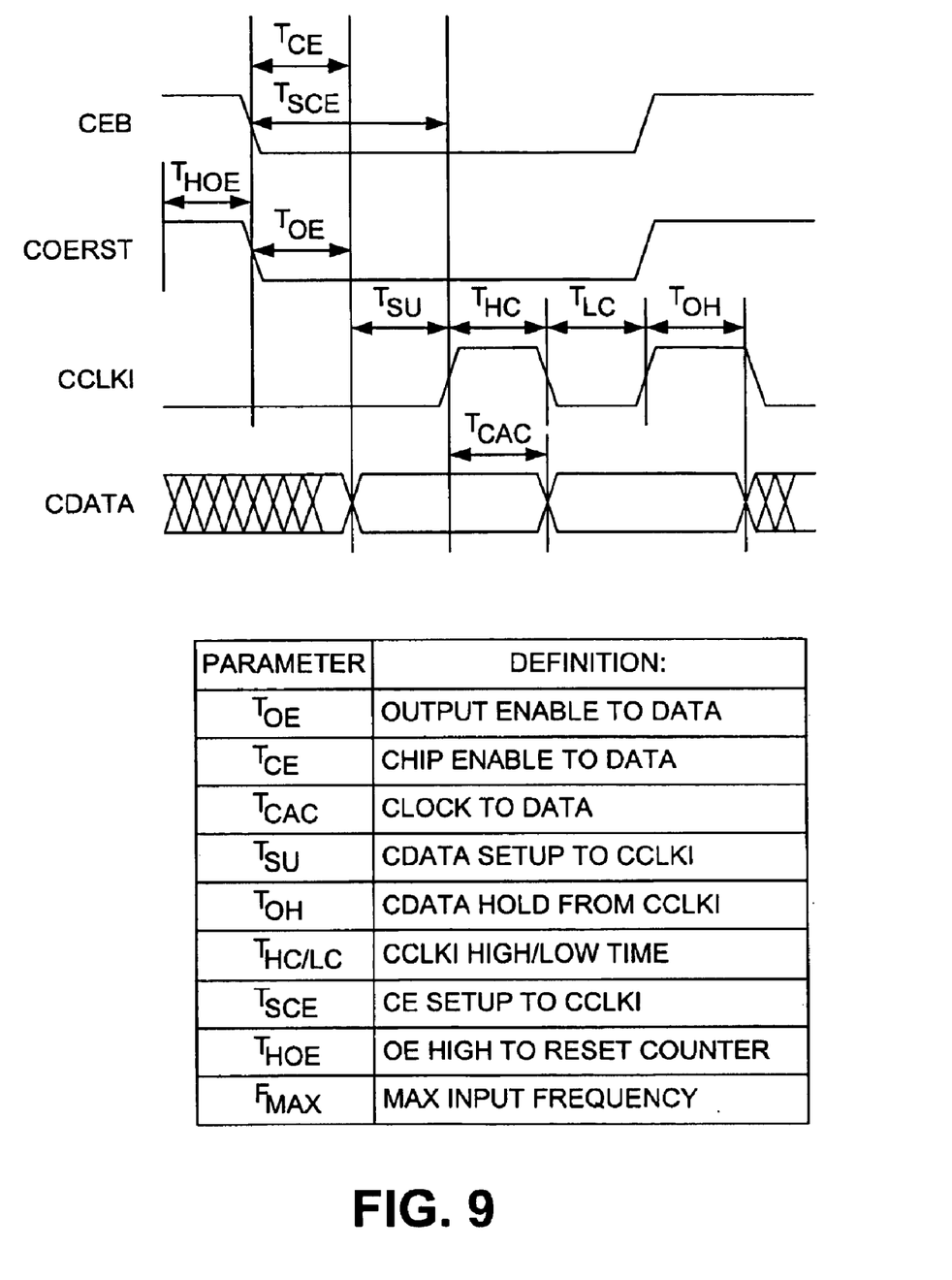
FIG. 9 is a timing diagram illustrating an example memory access by the apparatus of FIG. 2.

Referring to FIG. 9, a timing diagram illustrating an example read operation of the serial EEPROM memory device 114 is shown. Various timing parameters of a read cycle of the serial memory may be related as shown.

The state machines 312 of FIGS. 3 and 6 generally control the timing parameters illustrated in FIGS. 8 and 9. The signals NVCSB, NVCEB, COERST and CCCLKI may be inactive (e.g., 1,1,1,0, respectively) when the state machine 312 is in the states 400 and 410. The signals NVCSB, NVCEB, COERST and CCCLKI may be active (e.g., 0,0,0,0 to 1 to 0, respectively) when the state machine 312 is in the other states. The signal CCLKI is generally toggled when the state machine 312 is in the states 402, 404, 406, and 408. When the state machine 312 is in the state 402, the state machine 312 may control (i) the address counter 310 to increment the value of the signal NVADD and (ii) the register 318 to load data from the signal NVDATA.

While the invention has been particularly shown and described with reference to the preferred embodiments thereof, it will be understood by those skilled in the art that various changes in form and details may be made without departing from the spirit and scope of the invention.

What is claimed is:

1. A programmable logic device comprising:
a configuration controller configured to (i) retrieve data in response to one or more outputs of said programmable logic device and (ii) program a number of configuration bits of said programmable logic device in response to said data, wherein said data is retrieved (i) via a serial interface when said configuration controller is in a first mode, (ii) via a parallel interface when said configuration controller is in a second mode, and (iii) via a JTAG interface when said configuration controller is in a third mode.

2. The programmable logic device according to claim 1, wherein said data is retrieved from a parallel flash memory device when said controller is in said second mode.

3. The programmable logic device according to claim 2, wherein said data is retrieved from a serial EPROM when said configuration controller is in said first mode.

4. The programmable logic device according to claim 1, wherein said data is compressed.

5. The programmable logic device according to claim 4, wherein said compressed data comprises Huffman coded configuration data.

6. The programmable logic device according to claim 4, wherein said configuration controller comprises a circuit configured to decompress said compressed data.

7. The programmable logic device according to claim 1, wherein said data comprises a number of cyclic redundancy check (CRC) bits.

8. The programmable logic device according to claim 7, wherein said number of cyclic redundancy check (CRC) bits provides 100% coverage for all single and double bit errors.

9. The programmable logic device according to claim 1, wherein said configuration controller comprises a circuit configured to perform a cyclic redundancy check on said data.

10. The programmable logic device according to claim 9, wherein said configuration controller aborts configuration in response to a failed cyclic redundancy check.

11. The programmable logic device according to claim 1, wherein said configuration controller comprises a number of ports.

12. The programmable logic device according to claim 11, wherein said number of ports comprises a JTAG port, a serial port, and a parallel port.

13. The programmable logic device according to claim 12, wherein said JTAG port is configured to communicate with said parallel port.

14. The programmable logic device according to claim 11, wherein one or more signals of a first port can be monitored on a second port.

15. A programmable logic device comprising:

means for retrieving data in response to one or more outputs of said programmable logic device, wherein said data is retrieved (i) via a serial interface in a first mode, (ii) via a parallel interface in a second mode, and (iii) via a JTAG interface in a third mode; and means for programming a number of configuration bits of said programmable logic device in response to said data.

16. A method for configuring a programmable logic device comprising the steps of:

(A) retrieving data in response to one or more outputs of said programmable logic device, wherein said data is retrieved (i) via a serial interface when in a first mode, (ii) via a parallel interface when in a second mode, and (iii) via a JTAG interface when in a third mode;

(B) programming a number of configuration bits of said programmable logic device in response to said data.

17. The method according to claim 16, wherein step B further comprises:

decompressing said data according to a predetermined compression scheme.

18. The method according to claim 17, wherein said data comprises Huffman coded configuration data.

19. The method according to claim 16, wherein step B further comprises:

checking for single and double bit errors in said data; and aborting said programming if an error is detected.

20. The method according to claim 19, wherein a cyclic redundancy check (CRC) is used.

* * * * *